United States Patent
Park et al.

(10) Patent No.: US 11,171,211 B1
(45) Date of Patent: Nov. 9, 2021

(54) GROUP IV AND III-V P-TYPE MOSFET WITH HIGH HOLE MOBILITY AND METHOD OF MANUFACTURING THE SAME

(71) Applicant: Samsung Electronics Co., Ltd., Suwon-si (KR)

(72) Inventors: Hong-Hyun Park, Fremont, CA (US); Zhengping Jiang, San Jose, CA (US); Hesameddin Ilatikhameneh, Sunnyvale, CA (US); Woosung Choi, Milpitas, CA (US); Chihak Ahn, Fremont, CA (US)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/900,788

(22) Filed: Jun. 12, 2020

Related U.S. Application Data

(60) Provisional application No. 63/022,952, filed on May 11, 2020.

(51) Int. Cl.
  *H01L 29/10* (2006.01)
  *H01L 29/08* (2006.01)
  (Continued)

(52) U.S. Cl.
  CPC ...... *H01L 29/1033* (2013.01); *H01L 21/0259* (2013.01); *H01L 21/0262* (2013.01);
  (Continued)

(58) Field of Classification Search
  CPC ............. H01L 29/1033; H01L 29/0847; H01L 29/66568; H01L 21/02609; H01L 29/66522; H01L 21/0259
  See application file for complete search history.

(56) References Cited

U.S. PATENT DOCUMENTS

| | | |
|---|---|---|
| 7,547,637 B2 | 6/2009 | Brask et al. |
| 8,174,095 B2 | 5/2012 | Irisawa et al. |
| (Continued) | | |

OTHER PUBLICATIONS

A.H.A. Hassan et al., Anisotropy in the hole mobility measured along the [110] and [110] orientations in a strained Ge quantum well, Applied Physical Letters, 2014, 6 pages, 104, 132108, AIP Publishing.

*Primary Examiner* — Changhyun Yi
(74) *Attorney, Agent, or Firm* — Lewis Roca Rothperber Christie LLP

(57) ABSTRACT

A method of manufacturing a p-type MOSFET includes depositing a channel material to form a channel region, forming a source region and a drain region on each side of the channel region along a first direction, depositing a gate oxide layer on the channel region along a second direction crossing the first direction, and depositing a gate electrode on the gate oxide. The channel material includes a group IV element or III-V semiconductor compound and have a diamond or zincblende cubic crystal structure. A <001> direction of the crystal structure is parallel to the second direction. Two adjacent atoms on an out-most atomic layer of the channel region along the first direction are connected to each other via a single intervening atom, and an interface between the gate oxide layer and the channel region has a surface roughness of 1 angstrom or lower.

20 Claims, 12 Drawing Sheets

(51) Int. Cl.
*H01L 21/02* (2006.01)
*H01L 29/04* (2006.01)
*H01L 29/66* (2006.01)

(52) U.S. Cl.
CPC ...... *H01L 21/02609* (2013.01); *H01L 29/045* (2013.01); *H01L 29/0847* (2013.01); *H01L 29/66522* (2013.01); *H01L 29/66568* (2013.01)

(56) References Cited

U.S. PATENT DOCUMENTS

| | | | |
|---|---|---|---|
| 8,236,636 B2 | 8/2012 | Yin et al. | |
| 8,716,753 B2 | 5/2014 | Takizawa et al. | |
| 9,478,619 B2 | 10/2016 | Kato et al. | |
| 9,859,381 B2 | 1/2018 | Li et al. | |
| 10,453,841 B2 | 10/2019 | Chen et al. | |
| 2008/0134959 A1* | 6/2008 | Kasu | H01L 29/45 117/84 |
| 2009/0289304 A1 | 11/2009 | Pouydebasque et al. | |
| 2016/0336389 A1* | 11/2016 | Chang | H01L 29/66484 |

\* cited by examiner

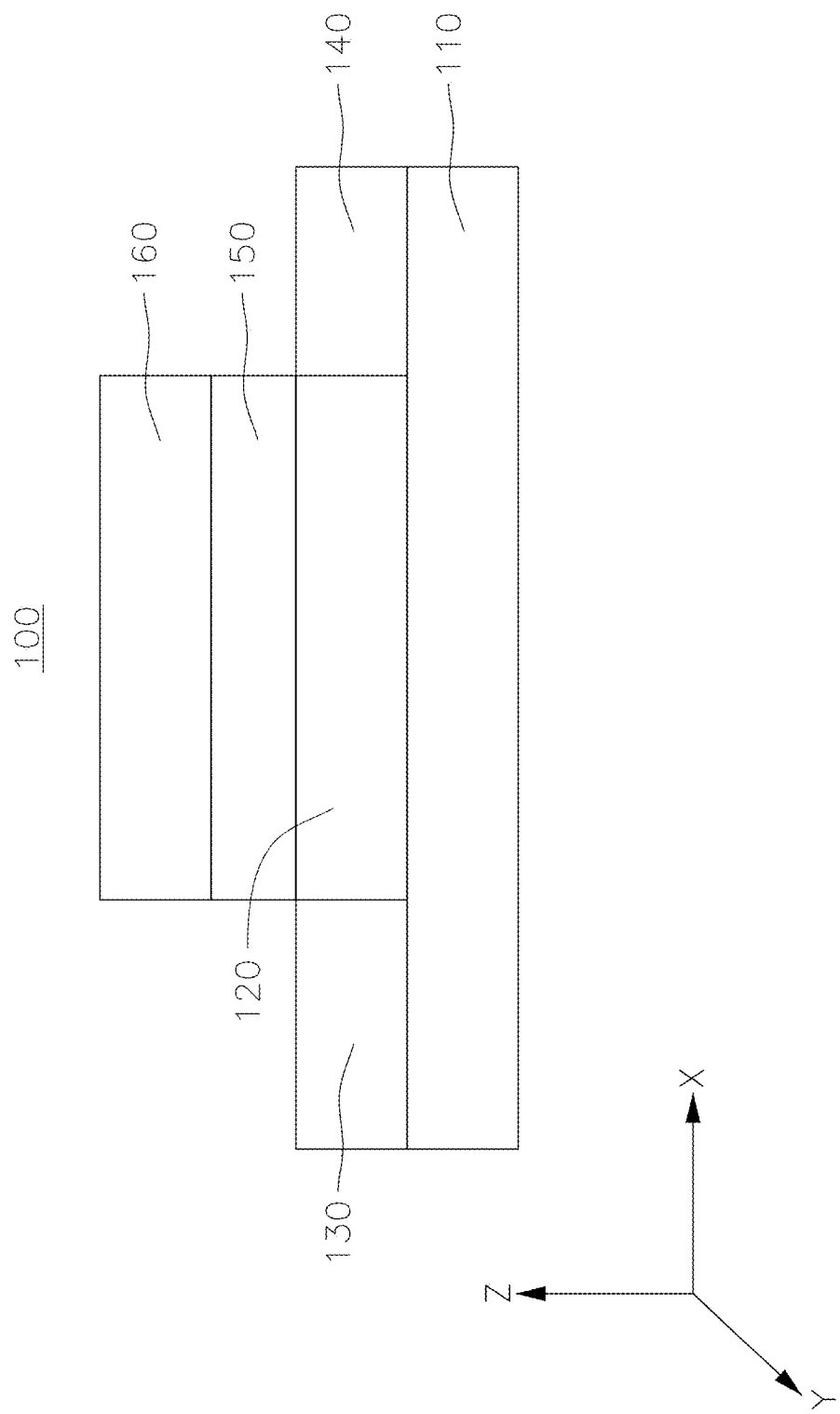

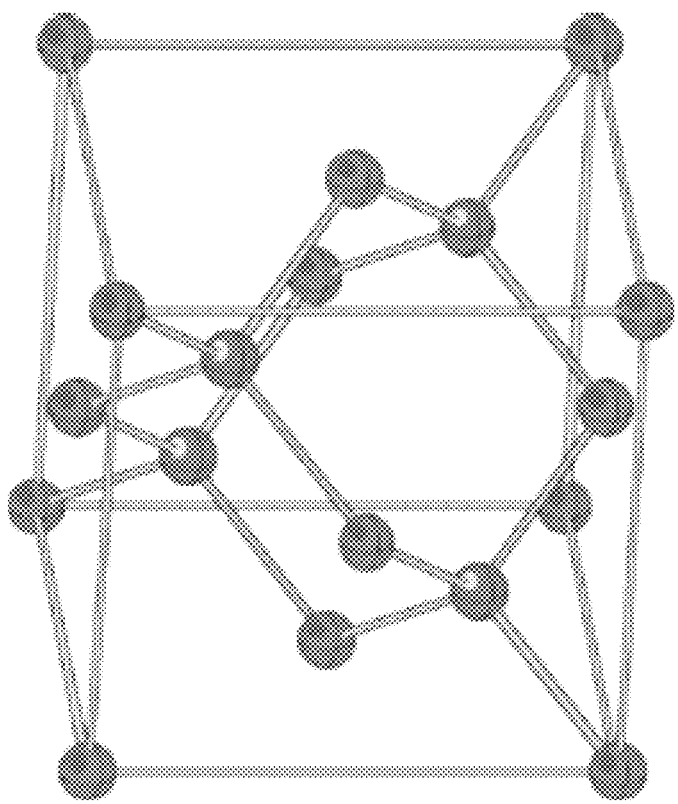
FIG. 2B
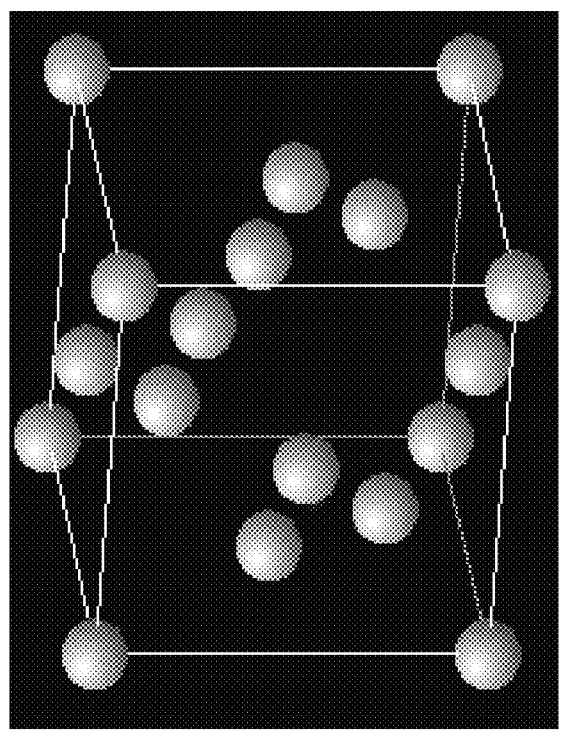
FIG. 2A
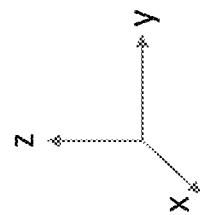

GROUP IV AND III-V P-TYPE MOSFET WITH HIGH HOLE MOBILITY AND METHOD OF MANUFACTURING THE SAME

CROSS-REFERENCE TO RELATED APPLICATION

The present application claims priority to and the benefit of U.S. Provisional Application No. 63/022,952, entitled "ATOMIC INTERFACE ENGINEERING FOR HIGH HOLE MOBILITY IN GROUP IV AND III-V p-TYPE MOSFETS", filed on May 11, 2020, the entire content of which is incorporated herein by reference.

FIELD

The present disclosure relates generally to a p-type field effect transistor (pFET), and/or to a p-type metal-oxide-semiconductor FET (MOSFET), and methods of manufacturing the same.

BACKGROUND

The metal-oxide-semiconductor field-effect transistor (MOSFET) is a widely utilized semiconductor device in digital and analog circuits, and a common power device. It is commonly utilized for amplifying or switching electronic signals. According to the type of current carriers in the channel region, a MOSFET may be a p-type MOSFET with holes being the carrier or an n-type MOSFET with electrons being the carrier.

In the p-type MOSFET, holes are conducted between p-type source and drain terminals.

There remains a need to increase the channel hole mobility of p-type MOSFETs.

The above information in the Background section is only for enhancement of understanding of the background of the technology and therefore it should not be construed as admission of existence or relevancy of the prior art.

SUMMARY

According to embodiments of the present disclosure, a method of manufacturing a p-type metal-oxide-semiconductor field-effect transistor (p-type MOSFET) includes: depositing a channel material on a substrate to form a channel region, forming a source region and a drain region on each side of the channel region along a first direction, depositing a gate oxide layer on the channel region, and depositing a gate electrode on the gate oxide layer, wherein the channel material includes a group IV element or III-V semiconductor compound, the channel material having a diamond or zincblende cubic crystal structure, wherein the depositing of the channel material includes: aligning a <001> direction of the diamond or zincblende cubic crystal structure to be perpendicular to a surface of the substrate on which the channel region is formed on, and wherein, along the first direction, two adjacent atoms on an out-most atomic layer of the channel region in contact with the gate oxide layer are connected to each other via a single intervening atom in an atomic layer immediately next to it in the diamond or zincblende cubic crystal structure, and controlling a surface roughness of an interface between the gate oxide layer and the channel region to be 1 angstrom or lower.

In an embodiment, the depositing of the channel material may further include: depositing the channel material on the substrate to form an intermediate layer, the intermediate layer having a thickness lower than a target thickness of the channel region, checking a number of intervening atoms between two adjacent atoms on an out-most atomic layer of the intermediate layer, and depositing a determined number of atomic layers of the channel material on the intermediate layer such that two adjacent atoms on the out-most atomic layer of the channel region are connected to each other via a single intervening atom in the layer immediately next to it in the diamond or zincblende cubic crystal structure, and the channel region has the target thickness.

In an embodiment, the intermediate layer may be selected from first to fifth atomic layers deposited on the substrate, and the determined number of atomic layers may include one or more atomic layers needed for the channel region to reach the target thickness.

In an embodiment, the channel region may have a total number of n atomic layers, n being an integer greater than 5, and the intermediate layer may be selected to be an n−1 or n−2 atomic layer.

In an embodiment, the depositing of the channel material may include growing the channel material on the substrate epitaxially, or depositing the channel material through atomic layer CVD (ALCVD) or atomic layer deposition (ALD).

In an embodiment, the channel material may include silicon (Si), germanium (Ge), gallium nitride (GaN), indium arsenide (InAs), gallium phosphide (GaP), gallium antimonide (GaSb), indium phosphide (InP), gallium arsenide (GaAs), or indium antimonide (InSb).

In an embodiment, the gate oxide layer may include silicon dioxide ($SiO_2$), hafnium oxide ($HfO_2$), hafnium silicon oxide ($HfSiO_2$), lanthanum oxide ($La_2O_3$), lanthanum aluminum oxide ($LaAlO_3$), zirconium oxide ($ZrO_2$), zirconium silicon oxide ($ZrSiO_4$), tantalum oxide ($Ta_2O_5$), titanium oxide ($TiO_2$), strontium titanate ($SrTiO_3$), yttrium oxide ($Y_2O_3$), aluminum oxide ($Al_2O_3$), lead scandium tantalate ($PbSc_{0.5}Ta_{0.5}O_3$), or lead zinc niobate ($PbZnNbO_3$).

In an embodiment, the controlling of the surface roughness may include annealing the channel region prior to the depositing of the gate oxide layer.

According to embodiments of the present disclosure, a method of manufacturing a p-type metal-oxide-semiconductor field-effect transistor (MOSFET) includes depositing a channel material on a first region of a substrate to form a first channel region, controlling a surface roughness of a first surface of the first channel region to a set value, forming a first source region and a first drain region on each side of the first channel region along a first direction, depositing a first gate oxide layer on the first surface of the first channel region, and depositing a first gate electrode on the first gate oxide layer to provide a first p-type MOSFET, wherein the channel material includes a group IV element or III-V semiconductor compound, the channel material having a diamond or zincblende cubic crystal structure, and a <001> direction of the diamond or zincblende cubic crystal structure is parallel to a second direction, the second direction being perpendicular to a surface of the substrate on which the first channel region is formed on, wherein the controlling of the surface roughness includes etching, intentionally incomplete deposition of the out-most atomic layer, or annealing.

In an embodiment, the set value of the surface roughness may be about 4 angstroms or greater.

In an embodiment, the method may further include: depositing the channel material on a second region of the substrate to form a second channel region, controlling a surface roughness of a first surface of the second channel region to the set value, forming a second source region and a second drain region on each side of the second channel region along the first direction, depositing a second gate oxide layer on the first surface of the second channel region, and depositing a second gate electrode on the second gate oxide layer to provide a second p-type MOSFET, wherein the set value of the surface roughness is about 4 angstroms or greater.

In an embodiment, the set value of the surface roughness may be 1 angstrom or lower, and wherein the depositing of the channel material may include: aligning the <001> direction of the diamond or zincblende cubic crystal structure to be parallel to the second direction, and wherein, along the first direction, two adjacent atoms on an out-most atomic layer of the first channel region in contact with the first gate oxide layer are connected to each other via a single intervening atom in an atomic layer immediately next to it in the diamond or zincblende cubic crystal structure.

In an embodiment, the depositing of the channel material may further include: depositing the channel material on the substrate to form an intermediate layer, the intermediate layer having a thickness lower than a target thickness of the first channel region, checking a number of intervening atoms between two adjacent atoms on an out-most atomic layer of the intermediate layer, and depositing a determined number of atomic layers of the channel material on the intermediate layer such that two adjacent atoms on the out-most atomic layer of the first channel region are connected to each other via a single intervening atom in the layer immediately next to it, and the first channel region has the target thickness.

According to embodiments of the present disclosure, a p-type metal-oxide-semiconductor field-effect transistors (MOSFET) includes: a source region, a drain region, and a channel region between the source region and the drain region along a first direction, a gate electrode over the channel region, and a gate oxide layer between the gate electrode and the channel region, wherein the channel region includes a channel material including a group IV element or III-V semiconductor compound, the channel material having a diamond or zincblende cubic crystal structure, and a <001> direction of the diamond or zincblende cubic crystal structure is perpendicular to a surface of the substrate on which the channel region is formed on, wherein, along the first direction, two adjacent atoms on an out-most atomic layer of the channel region in contact with the gate oxide layer are connected to each other via a single intervening atom in an atomic layer immediately next to it in the diamond or zincblende cubic crystal structure, and wherein an interface between the gate oxide layer and the channel region has a surface roughness of 1 angstrom or lower.

In an embodiment, the channel material may include silicon (Si), germanium (Ge), gallium nitride (GaN), indium arsenide (InAs), gallium phosphide (GaP), gallium antimonide (GaSb), indium phosphide (InP), gallium arsenide (GaAs), or indium antimonide (InSb).

In an embodiment, a hole mobility of the channel region may be greater than a hole mobility of a bulk counterpart of the same channel material.

In an embodiment, the gate oxide layer may include silicon dioxide ($SiO_2$), hafnium oxide ($HfO_2$), hafnium silicon oxide ($HfSiO_2$), lanthanum oxide ($La_2O_3$), lanthanum aluminum oxide ($LaAlO_3$), zirconium oxide ($ZrO_2$), zirconium silicon oxide ($ZrSiO_4$), tantalum oxide ($Ta_2O_5$), titanium oxide ($TiO_2$), strontium titanate ($SrTiO_3$), yttrium oxide ($Y_2O_3$), aluminum oxide ($Al_2O_3$), lead scandium tantalate ($PbSc_{0.5}Ta_{0.5}O_3$), or lead zinc niobate ($PbZnNbO_3$).

In an embodiment, the p-type MOSFET may be selected from a planar MOSFET, a multi-gate FET, a double gate MOSFET, a tri-gate MOSFET, a fin field-effect transistor (FinFET), a FlexFET, a thin film transistor, a gate-all-around MOSFET (GAAFET), and a multi-bridge channel FET (MBCFET).

This summary is provided to introduce a selection of features and concepts of embodiments of the present disclosure that are further described below in the detailed description. This summary is not intended to identify key or essential features of the claimed subject matter, nor is it intended to be used in limiting the scope of the claimed subject matter. One or more of the described features may be combined with one or more other described features to provide a workable device.

BRIEF DESCRIPTION OF THE DRAWINGS

These and other features and advantages of embodiments of the present disclosure will become more apparent by reference to the following detailed description when considered in conjunction with the following drawings. In the drawings, like reference numerals are used throughout the figures to reference like features and components. The figures are not necessarily drawn to scale.

FIG. 1 is a schematic cross-sectional view of a p-type metal-oxide-semiconductor field-effect transistor (MOSFET) according to an example embodiment.

FIGS. 2A-2B are schematic illustrations of a unit cell of a diamond or zincblende crystal structure.

DETAILED DESCRIPTION

Figure 3:
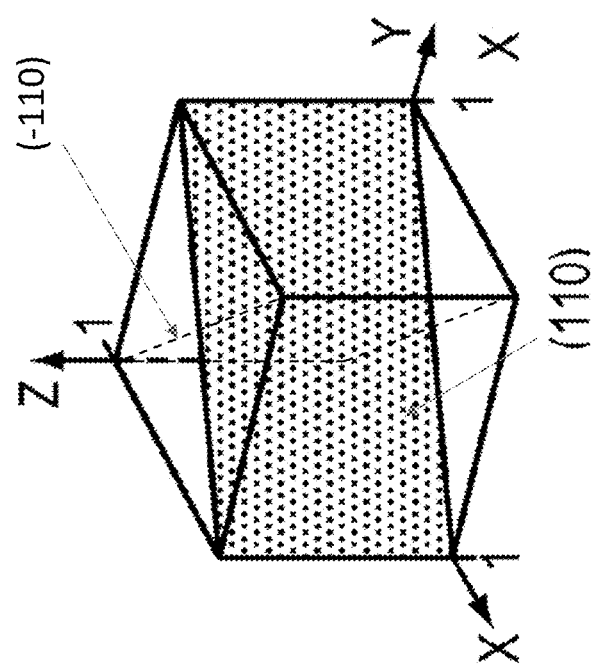
FIG. 3 schematically illustrates two perpendicular planes in a cubic crystal structure.

The present disclosure is directed to various embodiments of group IV and III-V p-type metal-oxide-semiconductor field-effect transistor (MOSFET) with improved hole mobility and method of manufacturing the same. The p-type MOSFET of the present disclosure includes a group IV or III-V channel material having a diamond or zincblende crystal structure. By controlling the out-most atomic layer of the channel material closest to the gate dielectric layer such that, along the direction from the source region to the drain region, two adjacent atoms on the out-most atomic layer of the channel region in contact with the gate dielectric layer are connected through a single atom underneath in the diamond or zincblende crystal structure, and by controlling the surface roughness of the interface between the channel region and the gate dielectric layer to be atomically smooth (e.g., having a surface roughness of 1 angstrom or lower), hole mobility in the channel region can be significantly improved compared to the hole mobility of the bulk channel material, or the hole mobility of a device without the specific configuration of the out-most atomic layer and/or without the smoothness at the interface between the channel region and the gate dielectric layer described above.

Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof may not be repeated.

In the following description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

When a certain embodiment may be implemented differently, a specific process order may be performed differently from the described order. For example, two consecutively described processes may be performed substantially at the same time or performed in an order opposite to the described order.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

According to one or more embodiments of the present disclosure, a p-type MOSFET includes a source region, a drain region, and a channel region between the source region and the drain region along a first direction; a gate electrode over the channel region; and a gate dielectric layer between the gate electrode and the channel region. The channel region includes a channel material formed of a group IV element or a III-V semiconductor compound, the channel material having a diamond or zincblende crystal structure and having a first crystallographic direction parallel to the first direction, and a second crystallographic direction and a third crystallographic direction perpendicular to each other. Along the first direction, two adjacent atoms on an out-most atomic layer of the channel region in contact with the gate dielectric layer are connected to each other via a single intervening atom in an atomic layer immediately under it in the diamond or zincblende crystal structure. Furthermore, an interface between the gate dielectric layer and the channel region has a surface roughness (RMS) of 1 angstrom or lower.

For purposes of explanation, a single gate planar p-type MOSFET will be described in more detail with reference to FIG. 1. However, the present disclosure is not limited thereto, and any suitable p-type MOSFET may be manufactured according to embodiments of the present disclosure.

FIG. 1 is a schematic cross-sectional view of a single gate p-type MOSFET 100 according to an example embodiment. Referring to FIG. 1, the p-type MOSFET 100 according to the example embodiment includes a substrate 110, a channel region 120, a source region 130, a drain region 140, a gate oxide/dielectric layer 150 and a gate electrode 160. The channel region 120 is between the source region 130 and the drain region 140 along a first direction (e.g., the x-axis direction shown in FIG. 1). The gate electrode 160 is over the channel region 120 along a second direction (e.g., the y-axis direction shown in FIG. 1) crossing the first direction. The gate oxide layer is between the gate electrode 160 and the channel region 120 along the second direction.

The channel region 120 includes a channel material formed of a group IV element or a III-V semiconductor compound. In one embodiment, the channel region 120 may be formed of silicon (Si), germanium (Ge), gallium nitride (GaN), indium arsenide (InAs), gallium phosphide (GaP), gallium antimonide (GaSb), indium phosphide (InP), gallium arsenide (GaAs), indium antimonide (InSb), etc.

These channel materials each have a diamond or zincblende crystal structure. Diamond and zincblende crystal structures are similar to each other, with the main difference being that the diamond crystal structure is made up of a single atomic species (carbon atoms for diamond, silicon atoms for silicon crystals, germanium atoms for germanium crystals, etc.) while the zincblende crystal structure is made up of two different atomic species (e.g., zinc and sulfur atoms for ZnS, indium and arsenic atoms for InAs, etc.).

In each of the crystal structures, the atoms that make up the solid are arranged in a periodic fashion. The periodic arrangement of atoms in a crystal is called the crystal lattice. The crystal lattice contains a volume which is representative of the entire lattice and is referred to as a unit cell that is regularly repeated throughout the crystal structure.

FIGS. 2A-2B are schematic illustrations of a unit cell of a diamond or zincblende crystal structure. FIG. 2A schematically illustrates the arrangement of atoms within a unit cell while FIG. 2B schematically illustrates the bonding of atoms within the unit cell.

In the description herein, references to various planes in the crystals will be made, especially to the (001), (110), and ($\bar{1}$10) planes. These planes define the orientation of the plane of atoms relative to the principle crystalline axes x, y and z. The numbers {xyz} are referred to as Miller indices and are determined from the reciprocals of the points at which the crystal plane intersects the principle crystalline axes. For example, the (001) plane is the top surface shown in FIGS. 2A and 2B, perpendicular to the z axis.

Throughout the description, reference will also be made to the crystal directions (orientations), especially the [001], [110] and [$\bar{1}$10] directions. These are defined as the normal direction to the respective plane. For example, the direction [100] is the direction normal to the (100) plane. The notation <xyz> refers to all six equivalent directions.

FIG. 3 schematically illustrates two perpendicular planes in a cubic crystal structure. Referring to FIG. 3, the (110) plane represents a plane parallel to [001] direction (e.g., the z axis direction) and [110] direction (e.g., parallel to a line direction which intersects each of the x axis and y axis at 1 on the x-y plane). The ($\bar{1}$10) plane represents a plane parallel to [001] and [$\bar{1}$10] (e.g., parallel to a line direction which intersects the x axis at −1 and the y axis at 1 on the x-y plane). Furthermore, the (110) plane is perpendicular to the ($\bar{1}$10) plane.

Due to the bonding arrangement of atoms in the diamond or zincblende crystal structure, when the z axis is aligned with the [001] direction, two vertical cross-sections perpendicular to each other, i.e., along a plane parallel to [001] and [110] directions and along a plane parallel to [001] and [$\bar{1}$10] directions respectively, may have different atom arrangements on the top layers for a given X-Y plane cross-section. The [110] and [$\bar{1}$10] directions are perpendicular to each other, and each in a plane that runs perpendicular to the [001] direction.

In the related art, it is believed that the hole mobility is the same for a given channel material when the thickness direction is aligned with the <100> direction of the crystal structure, irrespective of which crystal orientation is aligned along the direction from the source region to the drain region (i.e., the first direction). However, when the channel region 120 is formed according to embodiments of the present disclosure (i.e., such that the crystal structure is aligned according to the embodiment illustrated in FIG. 5), it is discovered surprisingly that, when combined with an atomically smooth interface with the gate oxide/dielectric layer, the hole mobility is significantly greater than that of the configuration illustrated in FIG. 6.

In more detail, according to embodiments of the present disclosure, the channel region is formed such that the channel material may have a first crystallographic direction parallel to the first direction (i.e., the direction in which the source region, the channel region and the drain region are arranged sequentially), a second crystallographic direction parallel to the second direction (e.g., the direction perpendicular to the surface of the substrate on which the channel region is formed, the y-axis direction, or in which the channel region, the gate oxide layer and the gate electrode are arranged sequentially as shown in FIG. 1) and a third crystallographic direction perpendicular to the first and second crystallographic directions. In a cross section cut along a plane parallel to the first and second crystallographic directions, two adjacent atoms on an out-most atomic layer in contact with the gate oxide layer are connected to each other via a single intervening atom in an atomic layer immediately next to (e.g., under) it in the diamond or zincblende crystal structure.

Figure 4:
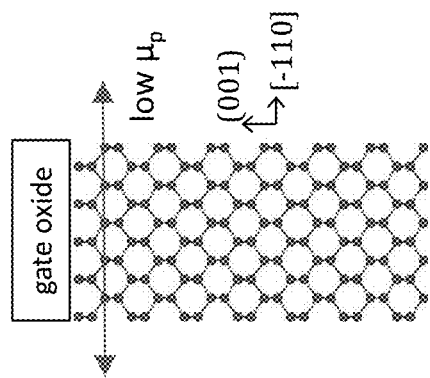
FIG. 4 is a schematic illustration of a channel material crystal structure.
Figure 5:
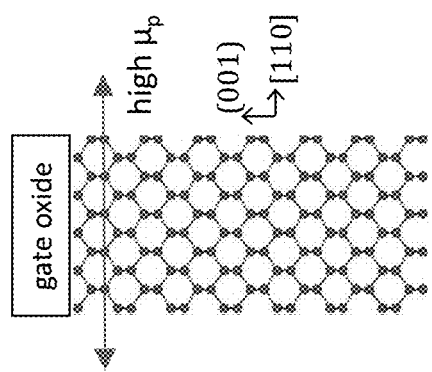
FIG. 5 is a schematic illustration of a sectional view of the channel material crystal structure of FIG. 4 cut along a plane parallel to [001] direction and [110] direction.
Figure 6:
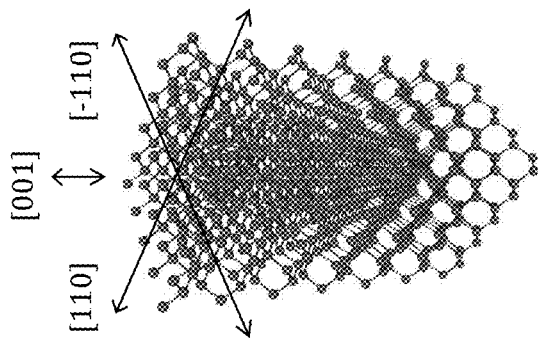
FIG. 6 is a schematic illustration of a sectional view of the channel material crystal structure of FIG. 4 cut along a plane parallel to [001] direction and [110] direction.
Figure 8:
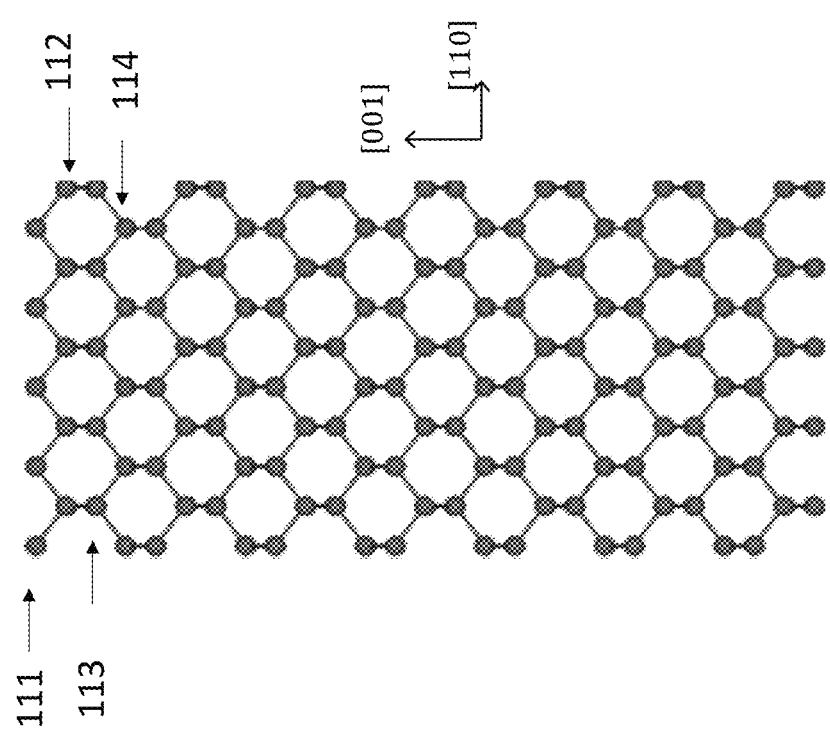
FIG. 8 is a schematic illustration of the configuration of the cross-section of a diamond or zincblende crystal material cut along a plane parallel to the [001] and [110] directions.

FIG. 4 is a schematic illustration of an example channel material crystal structure which is shaped to be cuboid and aligned with [001], [110], and [$\bar{1}$10] orientations. FIG. 5 is a schematic illustration of an example sectional view of the channel material crystal structure cut along a plane parallel to [001] direction and [110] direction. FIG. 6 is a schematic illustration of an example sectional view of the channel material crystal structure cut along a plane parallel to [001] direction and [$\bar{1}$10] direction. FIG. 8 is a schematic illustration of the configuration of the cross-section of an example diamond or zincblende crystal material cut along a plane parallel to the [001] and [110] directions.

Referring to FIGS. 4-6, the channel material has the diamond or zincblende cubic crystal structure, with the [001] direction aligned with the thickness direction of the channel region (i.e., the second direction, or the direction perpendicular to the channel region-gate oxide layer interface), and the out-most (e.g., top-most as shown in FIGS. 5-6) atomic layer of the channel material is in contact with the gate oxide/dielectric layer. In the cross-section shown in FIG. 5, two neighboring atoms on the out-most atomic layer of the channel material are connected to each other through a single intervening atom located in the layer immediately under the out-most atomic layer (i.e., the second out-most atomic layer). In the cross-section shown in FIG. 6, two neighboring atoms on the out-most atomic layer of the channel material are connected to each other through three intervening atoms located in the layers immediately under the out-most atomic layer (i.e., two atoms in the second out-most atomic layer and one atom in the third out-most atomic layer).

When the crystal structure of the channel material shows the configuration shown in FIG. 6 instead of FIG. 5, one or more additional atomic layers of the channel material may be further deposited until the crystal structure of the channel material has the configuration shown in FIG. 5. Due to the repetitive periodic arrangement of atoms in the diamond or zincblende crystal structure, the configuration shown in FIG. 5 and that shown in FIG. 6 alternatively appear for the out-most atomic layer.

Referring to FIG. 8, the top few atomic layers are referred to respectively as the out-most atomic layer (i.e., the layer in contact with the gate oxide layer) 111, the second out-most atomic layer 112 located immediately next to the out-most atomic layer 111, the third out-most atomic layer 113 located immediately next to the second out-most atomic layer 112, and the fourth out-most atomic layer 114 located immediately next to the third out-most atomic layer 113. As shown in FIG. 8, every two adjacent atoms in the out-most atomic layer 111 are connected through a single intervening atom located in the second out-most atomic layer 112 (located immediately under the out-most atomic layer 111), forming a V-shaped structure (hereinafter, referred to as "the first atomic configuration"). Furthermore, every two adjacent atoms in the second out-most atomic layer 112 are connected through three intervening atoms located under it (hereinafter, referred to as "the second atomic configuration"), with two located in the third out-most atomic layer 113 (located immediately under the second out-most atomic layer 112) and one located in the fourth out-most atomic layer 114. In addition, every two adjacent atoms in the third out-most atomic layer 113 are connected through a single intervening atom located in the fourth out-most atomic layer 114 (located immediately under the third out-most atomic layer 113), forming a V-shaped structure. Here, the connection pattern to adjacent atoms in the same atomic layer through atom(s) located in atomic layer(s) underneath is the same for the out-most atomic layer 111 and the third out-most atomic layer 113. That is, the out-most atomic layer 111 and the third out-most atomic layer 113 both have the first atomic configuration. Also, as illustrated in FIG. 8, the connection pattern to adjacent atoms in the same atomic layer through atom(s) located in atomic layer(s) underneath is the same for the second out-most atomic layer 112 and the fourth out-most atomic layer 114. That is, the second out-most atomic layer 112 and the fourth out-most atomic layer 114 both have the second atomic configuration. In fact, the two connection patterns alternate repeatedly and periodically throughout the diamond or zincblende crystal structure along the [001] direction. Thus, the configuration shown in FIG. 5 may be converted into that of FIG. 6 by adding an odd number of layers, and may be maintained by adding an even number of layers. Likewise, the configuration shown in FIG. 6 may be converted into the configuration of FIG. 5 by adding an odd number of layers, and may be maintained by adding an even number of layers.

According to embodiments of the present disclosure, the channel region 120 is formed such that the crystal structure is aligned according to the embodiment illustrated in FIG. 5, i.e., two neighboring atoms on the out-most atomic layer of the channel material is connected to each other through a single intervening atom located in the layer immediately next to (e.g., under) the out-most atomic layer (i.e., the second out-most atomic layer) in the diamond or zincblende crystal structure, and along a direction connecting the source and the drain.

While a plane parallel to [001] direction and [110] direction is illustrated in FIGS. 5 and 8 as having the first atomic configuration, it is for the purpose of illustration only, and embodiments of the present disclosure are not limited thereto as long as the atomic configuration of the out-most atomic layer (in contact with the gate oxide layer) along the first direction (from the source region to the source region) has the first atomic configuration. That is, any equivalent crystallographic direction to the [001] direction and any equivalent crystallographic direction to the [110] direction may be utilized as long as the atoms on the out-most atomic layer are connected in the first atomic configuration described above.

An interface between the gate oxide layer and the channel region is atomically smooth. That is, the interface between the gate oxide layer and the channel region may have a surface roughness of 1 angstrom or lower. In one embodiment, the surface roughness is 0.9 angstroms. Here, the surface roughness value may be a root-mean-square (RMS) roughness value.

In one embodiment, a p-type MOSFET utilizing the configuration illustrated in FIG. 5 has a hole mobility that is at least 20% greater than that of a device utilizing the configuration illustrated in FIG. 6. In another embodiment, a p-type MOSFET utilizing the configuration illustrated in FIG. 5 has a hole mobility that is at least 30% greater than a device utilizing the configuration illustrated in FIG. 6.

Referring back to FIG. 1, the substrate 110 may be a semiconductor substrate, or may be an insulation substrate (e.g., glass). The surface of the substrate may have a crystallographic orientation (e.g., (100), (110), or (111)), however, the present disclosure is not limited thereto. In some embodiments, the selected crystallographic direction of the substrate is substantially aligned with the crystallographic direction of the channel material.

In one embodiment, the substrate 110 may be a group IV material wafer such as a silicon wafer, or a III-V compound wafer. Also, the substrate 110 may be a single crystalline wafer such as a silicon single crystalline wafer. In one embodiment, the substrate 110 may be an epitaxial wafer, a polished wafer, an annealed wafer, a silicon on insulator (SOI) wafer, etc. Here, the epitaxial wafer denotes a wafer formed by growing a crystalline material on a single crystalline silicon substrate. According to one or more example embodiments, the substrate 110 may include silicon (Si). According to another example embodiment, the substrate 110 may include a semiconductor atom such as a germanium (Ge), or a compound semiconductor material such as silicon carbide (SiC), gallium arsenide (GaAs), indium arsenide (InAs), and indium phosphide (InP). In one or more embodiments, the substrate 110 may be an n-type substrate.

The channel region 120 may have a thickness of about 100 nm or lower. However, the thickness of the channel region 120 is not limited to the above range.

The channel region 120 may not be doped with impurity ions. However, the channel region 120 may also be doped with the impurity ions. The channel region 120 may be doped to produce a p-type semiconductor. For example, a fine amount of impurity ions may be added as a dopant on the channel region 120.

The source and drain regions 130, 140 may be formed of the same material as the channel region 120 by doping the material formed of the group IV element or III-V compound with impurity ions. The source and drain regions 130, 140 may be doped of opposite type impurity ions to the channel region in the case of enhancement mode FETs, or doped of similar type of impurity ions to the channel region as in depletion mode FETs.

In general, a tetravalent carbon family element is used as the impurity ions in order to realize a p-channel MOSFET for the channel region 120 which includes a group IV element or III-V compound. However, the impurity ions are not limited to the carbon family, but elements of other families or metals may be utilized as the impurity ions. For example, ions of beryllium (Be), manganese (Mg), zinc (Zn), cadmium (Cd), or the like may be utilized to dope the material formed of the group IV element or III-V compound, thereby forming the source and drain regions 130, 140.

The gate oxide layer (also referred to as the gate dielectric layer) 150 may be directly on the channel region 120. The gate oxide layer 150 may have a thickness of about 2.2 nm to about 5 nm, but the present disclosure is not limited thereto. The gate oxide layer 150 may include an oxide material such as $SiO_2$. In addition, the gate oxide layer 150 may include a dielectric material having a high-k value. For example, the dielectric layer 142 may include hafnium oxide ($HfO_2$), hafnium silicon oxide ($HfSiO_2$), lanthanum oxide ($La_2O_3$), lanthanum aluminum oxide ($LaAlO_3$), zirconium oxide ($ZrO_2$), zirconium silicon oxide ($ZrSiO_4$), tantalum oxide ($Ta_2O_5$), titanium oxide ($TiO_2$), strontium titanate ($SrTiO_3$), yttrium oxide ($Y_2O_3$), aluminum oxide ($Al_2O_3$), lead scandium tantalate ($PbSc_{0.5}Ta_{0.5}O_3$), lead zinc niobate ($PbZnNbO_3$), etc.

The gate electrode 160 may be formed on the gate oxide layer 150 to have a single-layered structure or a multi-layered structure. The gate electrode 160 may have a thickness of about 20 nm to about 30 nm. The thickness of the gate electrode 160 is not limited to the above range. The gate electrode 160 may include a metal having a substantially high work function in order to increase a difference from the work function of the channel material including the group IV element or III-V compound. For example, the gate electrode 160 may include hafnium (Hf), zirconium (Zr), tantalum (Ta), aluminum (Al), ruthenium (Ru), palladium (Pd), platinum (Pt), cobalt (Co), nickel (Ni), tungsten (W), molybdenum (Mo), an oxide thereof, or an alloy thereof. The alloy may be or include a metal carbide including one or more of the above metals, for example, hafnium carbide (HfC), zirconium carbide (ZrC), titanium carbide (TiC), tantalum carbide (TaC), and/or aluminum carbide (AlCs).

The p-type MOSFET 100 may further include a spacer. The spacer may cover side walls of the gate oxide layer 150 and the gate electrode 160. The spacer may include silicon nitride or silicon oxide.

According to one or more embodiments of the present disclosure, a method of manufacturing a p-type MOSFET includes depositing a channel material on a substrate to form a channel region; forming a source region and a drain region on each side of the channel region along a first direction; depositing a gate oxide layer on the channel region; and depositing a gate electrode on the gate oxide layer. The channel material is formed of a group IV element or a III-V semiconductor compound, the channel material having a diamond or zincblende crystal structure and having a first crystallographic direction parallel to the first direction, a second crystallographic direction and a third crystallographic direction perpendicular to each other. Along the first direction, two adjacent atoms on an out-most atomic layer of the channel region in contact with the gate oxide layer are connected to each other via a single intervening atom in an atomic layer immediately next to it in the diamond or zincblende crystal structure. Furthermore, an interface between the gate oxide layer and the channel region has a surface roughness (RMS) of 1 angstrom or lower.

Figure 7:
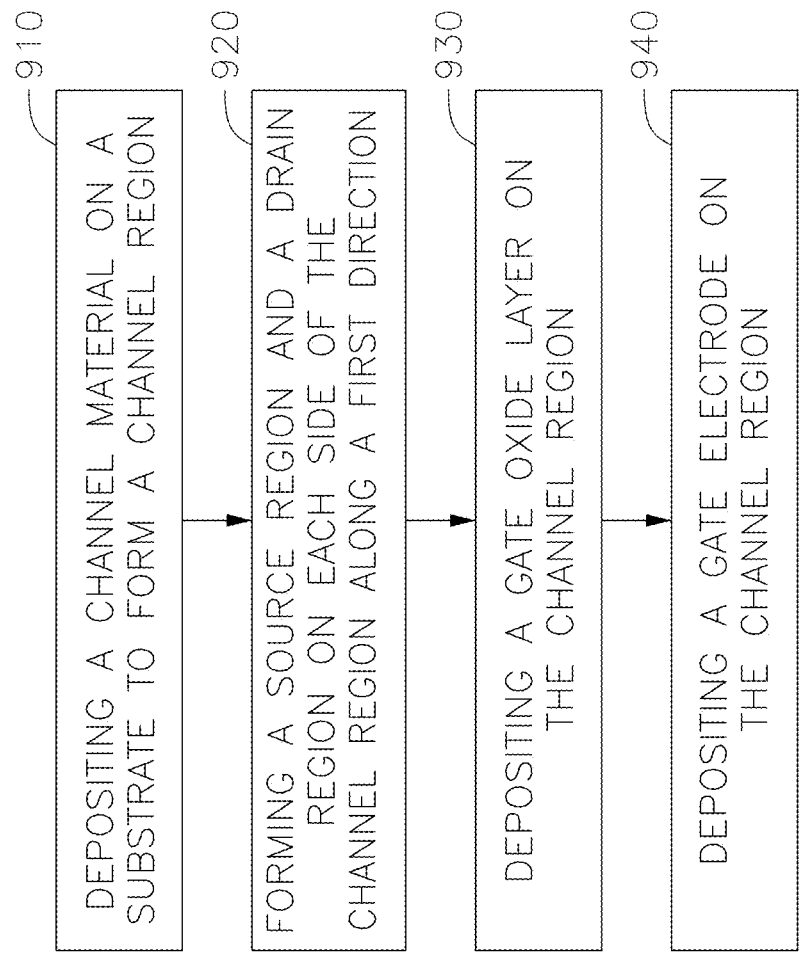
FIG. 7 is a flow chart illustrating a method of manufacturing a p-type MOSFET according to one or more embodiments of the present disclosure.

FIG. 7 is a flow chart illustrating a method of manufacturing a p-type MOSFET according to one or more embodiments of the present disclosure. Referring to FIG. 7, the method includes depositing a channel material on a substrate to form a channel region (act 910); forming a source region and a drain region on each side of the channel region along a first direction (act 920); depositing a gate oxide layer on the channel region (act 930); and depositing a gate electrode on the gate oxide (act 940).

The substrate may be a semiconductor substrate, or may be an insulation substrate (e.g., glass). In one embodiment, the substrate 110 may be a group IV material wafer such as a silicon wafer, or a III-V compound wafer. Also, the substrate 110 may be a single crystalline wafer such as a silicon single crystalline wafer. In one embodiment, the substrate 110 may be an epitaxial wafer, a polished wafer, an annealed wafer, a silicon on insulator (SOI) wafer, etc. Here, the epitaxial wafer denotes a wafer formed by growing a crystalline material on a single crystalline silicon substrate. According to one or more example embodiments, the substrate 110 may include silicon (Si). According to another example embodiment, the substrate 110 may include a semiconductor atom such as a germanium (Ge), or a compound semiconductor material such as silicon carbide (SiC), gallium arsenide (GaAs), indium arsenide (InAs), and/or indium phosphide (InP). In one or more embodiments, the substrate 110 may be an n-type substrate.

The channel material is formed of a group IV element or a III-V semiconductor compound with a diamond or zincblende crystal structure and having a first crystallographic direction parallel to the first direction, a second crystallographic direction parallel to a second direction, which is perpendicular to the surface of the substrate on which the channel region is formed, and a third crystallographic direction perpendicular to the first and second crystallographic directions. In a cross section cut along a plane parallel to the first and second directions, two adjacent atoms on an out-most atomic layer in contact with the gate oxide layer are connected to each other via a single intervening atom in an atomic layer immediately next to (e.g., under) it in the diamond or zincblende crystal structure.

The channel region may be formed utilizing any suitable method, for example, the channel region may be formed through epitaxially growing the channel material (such as metalorganic vapor-phase epitaxy (MOVPE), metal organic chemical vapor deposition (MOCVD), molecular-beam epitaxy (MBE), etc.), or through atomic layer CVD (ALCVD) or atomic layer deposition (ALD) of the channel material. The channel region is formed such that the crystallographic direction <001> (e.g., (001)) is aligned with the thickness direction of the channel region (i.e., the second direction, or y-axis direction shown in FIG. 1), and such that in a cross section cut along a plane parallel to the first and second directions, two adjacent atoms on an out-most atomic layer in contact with the gate oxide layer are connected to each other via a single intervening atom in an atomic layer immediately next to (e.g., under) it in the diamond or zincblende crystal structure.

During the deposition of the channel material, the configuration of the atoms on the out-most atomic layer may be monitored, and the deposition may be stopped when the thickness of the channel region reaches a set or predetermined value and concurrently, in a cross section cut along a plane parallel to the first and second directions, two adjacent atoms on an out-most atomic layer (to be in contact with the gate oxide layer) are connected to each other via a single intervening atom in an atomic layer immediately next to (e.g., under) it (e.g., in the configuration shown in FIG. 5).

Figure 9:
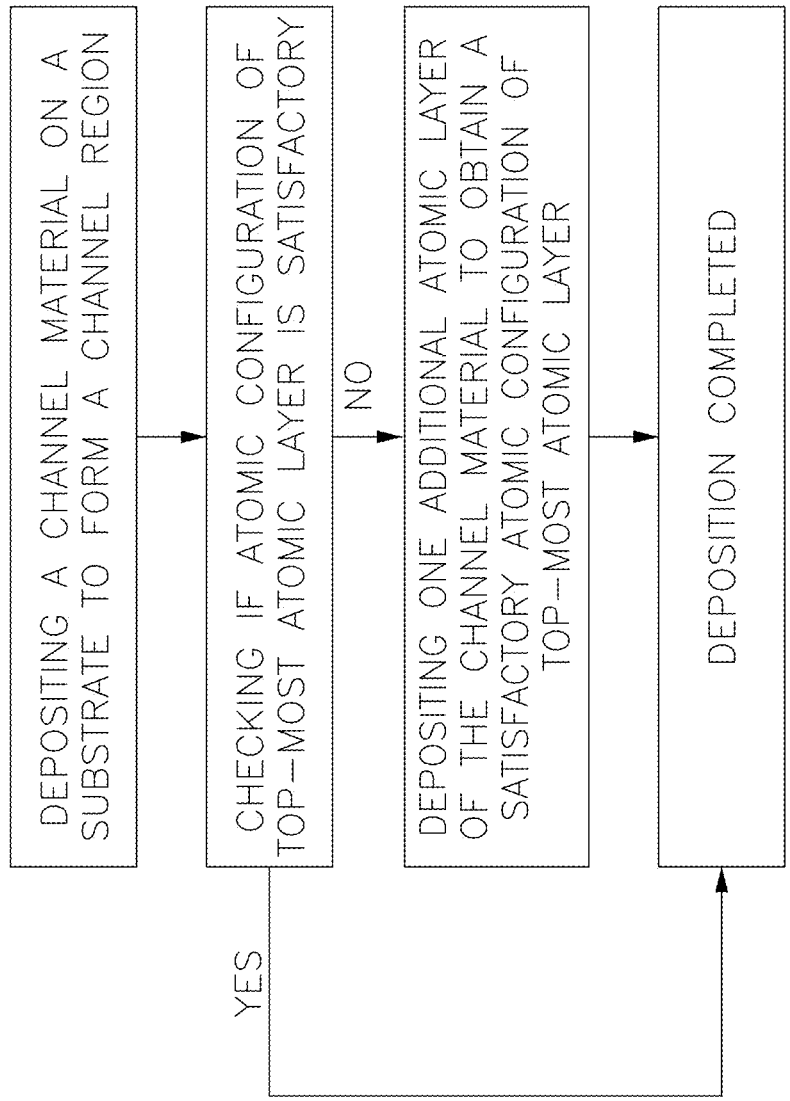
FIG. 9 is a flow chart illustrating a method of controlling the configuration of the channel material according to one or more embodiments of the present disclosure.

FIG. 9 is a flow chart illustrating a method of controlling the configuration of the channel material according to one or more embodiments of the present disclosure. Due to the alternative arrangement between the first atomic configuration and the second atomic configuration described above, a method of controlling the configuration of the channel material according to one or more embodiments of the present disclosure includes depositing a channel material on a substrate to a desired thickness to form a channel region, checking if the atomic configuration of the out-most atomic layer is the first atomic configuration (i.e., every two adjacent atoms in the out-most atomic layer are connected through a single intervening atom located in the atomic layer underneath), if the result is yes, then the deposition can be completed, and if the result is no, continue to deposit one additional atomic layer.

In one embodiment, the desired thickness is less than the target thickness for the channel region, and the additional atomic layer may be three, five or any other odd number of additional atomic layers to bring the thickness of the channel region to the target thickness.

Figure 10:
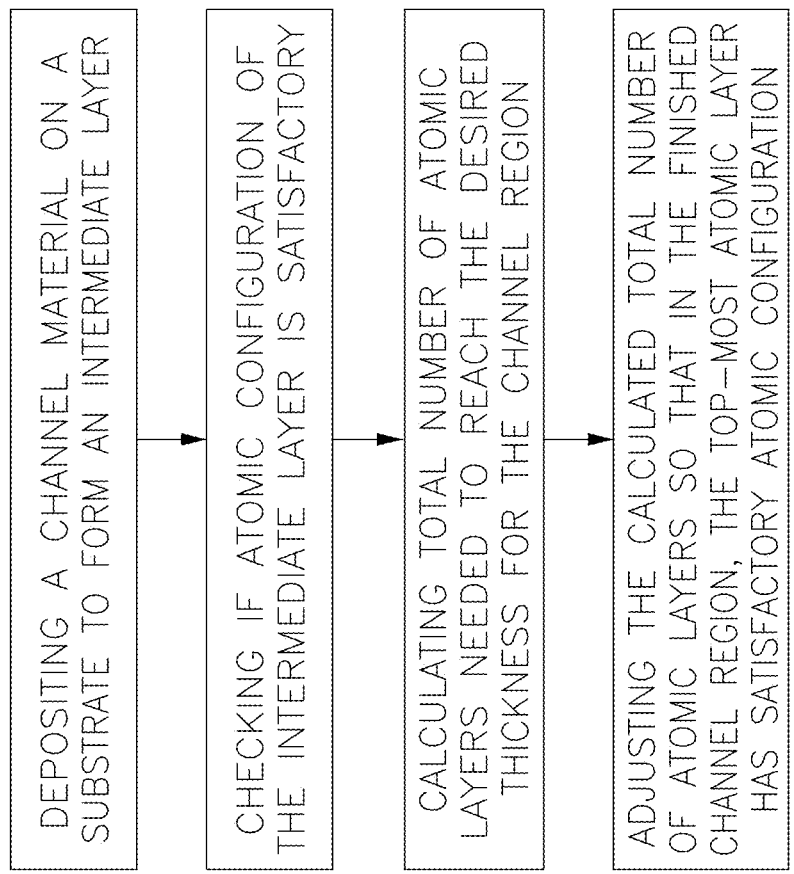
FIG. 10 is a flow chart illustrating a method of controlling the configuration of the channel material according to one or more embodiments of the present disclosure.

FIG. 10 is a flow chart illustrating a method of controlling the configuration of the channel material according to one or more embodiments of the present disclosure. Referring to FIG. 10, checking if the atomic configuration of the out-most atomic layer is the first atomic configuration (i.e., every two adjacent atoms in the out-most atomic layer are connected through a single intervening atom located in the atomic layer underneath) may be conducted on an intermediate layer before the thickness of the channel material reaches the target thickness of the channel region, e.g., at the completion of deposition of the first atomic layer on the substrate. The total number of atomic layers needed to reach the target thickness can be calculated based on the size of the atoms, and the calculated total number of atomic layers may be adjusted depending on the atomic configuration observed. That is, if the atomic configuration observed on the intermediate layer is the first atomic configuration, the additional number of layers deposited on the intermediate layer would be an even number to maintain the first atomic configuration on the out-most atomic layer, and if the atomic configuration observed is the second atomic configuration, the additional number of layers deposited would be an odd number to provide the out-most layer of the finished channel region with the first atomic configuration. In one embodiment, the final number of atomic layers of the channel region may be +/−1 atomic layer from the calculated number of atomic layers to provide the first atomic configuration on the out-most layer of the channel region.

The atomic configuration of out-most atomic layer may be obtained utilizing any suitable techniques, such as atomic force microscopy (AFM), transmission electron microscopy (TEM), etc.

The gate oxide layer may include an oxide material such as $SiO_2$. In addition, the gate oxide layer 150 may include a dielectric material having a high-k value. For example, the gate oxide layer may include hafnium oxide ($HfO_2$), hafnium silicon oxide ($HfSiO_2$), lanthanum oxide ($La_2O_3$), lanthanum aluminum oxide ($LaAlO_3$), zirconium oxide ($ZrO_2$), zirconium silicon oxide ($ZrSiO_4$), tantalum oxide ($Ta_2O_5$), titanium oxide ($TiO_2$), strontium titanate ($SrTiO_3$), yttrium oxide ($Y_2O_3$), aluminum oxide ($Al_2O_3$), lead scandium tantalate ($PbSc_{0.5}Ta_{0.5}O_3$), lead zinc niobate ($PbZnNbO_3$), etc.

The gate oxide layer may be formed by various suitable deposition methods such as chemical vapor deposition (CVD), low pressure CVD (LPCVD), atmospheric pressure CVD (APCVD), low temperature CVD (LTCVD), plasma enhanced CVD (PECVD), atomic layer CVD (ALCVD), atomic layer deposition (ALD), and physical vapor deposition (PVD).

An interface between the gate oxide layer and the channel region has a surface roughness of about 1 angstroms or lower. The interface roughness may be controlled by any suitable method, such as carefully controlling the deposition of the channel material and the gate oxide material to have a defect-free interface. In one embodiment, the interface roughness may be controlled through annealing.

The source region, the drain region and the gate electrode may be formed utilizing any suitable method available to those skilled in the art. In one embodiment, the source and drain regions may be formed of the same material as the channel region through the same deposition process, and by additionally doping the material with impurity ions. The source and drain regions may be doped of opposite type impurity ions to the channel region in the case of enhancement mode FETs, or doped of similar type of impurity ions to the channel region as in depletion mode FETs.

In one embodiment, a tetravalent carbon family element, or ions of beryllium (Be), manganese (Mg), zinc (Zn), cadmium (Cd), or the like, may be utilized to dope the material formed of the group IV element or III-V compound, thereby forming the source and drain regions.

Figure 11:
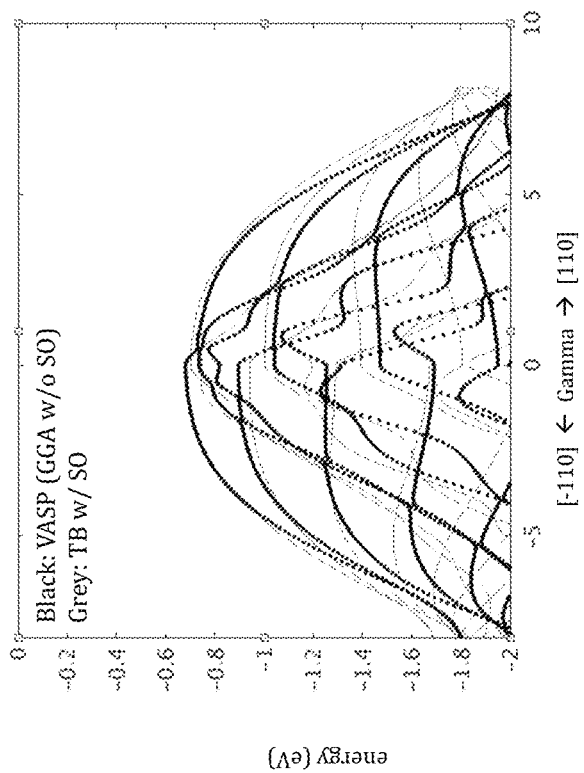
FIG. 11 shows the valence band structure along [110] and [110] directions of a silicon channel calculated utilizing density functional theory (DFT) and tight-binding methods.

FIG. 11 shows the valence band structure along [110] and [$\bar{1}$10] directions of a silicon channel calculated utilizing density functional theory (DFT) and tight-binding methods. For bulk materials, they would be symmetric. However, FIG. 11 shows that the bands along [110] and [$\bar{1}$10] are not symmetric due to the termination of atoms on the (001) interface. The effect is expected to remain as long as the surface roughness on the gate oxide is small enough.

While FIG. 1 shows a single-gate planar p-type MOSFET, the present disclosure is not limited thereto. For example, a multi-gate pFET (such as a double-gate MOSFET, a tri-gate FET, a fin field-effect transistor (FinFET), etc.), a thin film transistor, a gate-all-around MOSFET (GAAFET), a multi-bridge channel FET (MBCFET), and/or any other devices with a structure and operating principle similar to the p-type MOSFET can be formed utilizing the structure and method described above. Due to the symmetrical features of the diamond or zincblende cubic crystal structure, multiple interfaces between the channel region and the multi-gate pFETs can each be engineered according to embodiments of the present disclosure, such that the atomic configuration of the out-most atomic layer of the channel region (e.g., at an interface between a top gate oxide layer and the channel region and an interface between a bottom gate oxide layer and the channel region) may have the first atomic configuration according to embodiments of the present disclosure (i.e., two neighboring atoms on the top-most atomic layer of the channel region are connected to each other through a single intervening atom located in the layer immediately next to it, and two neighboring atoms on the bottom-most atomic layer of the channel region are connected to each other through a single intervening atom located in the layer immediately next to it), and the each of the interfaces may have the surface roughness of 1 angstrom or lower.

Figure 12:
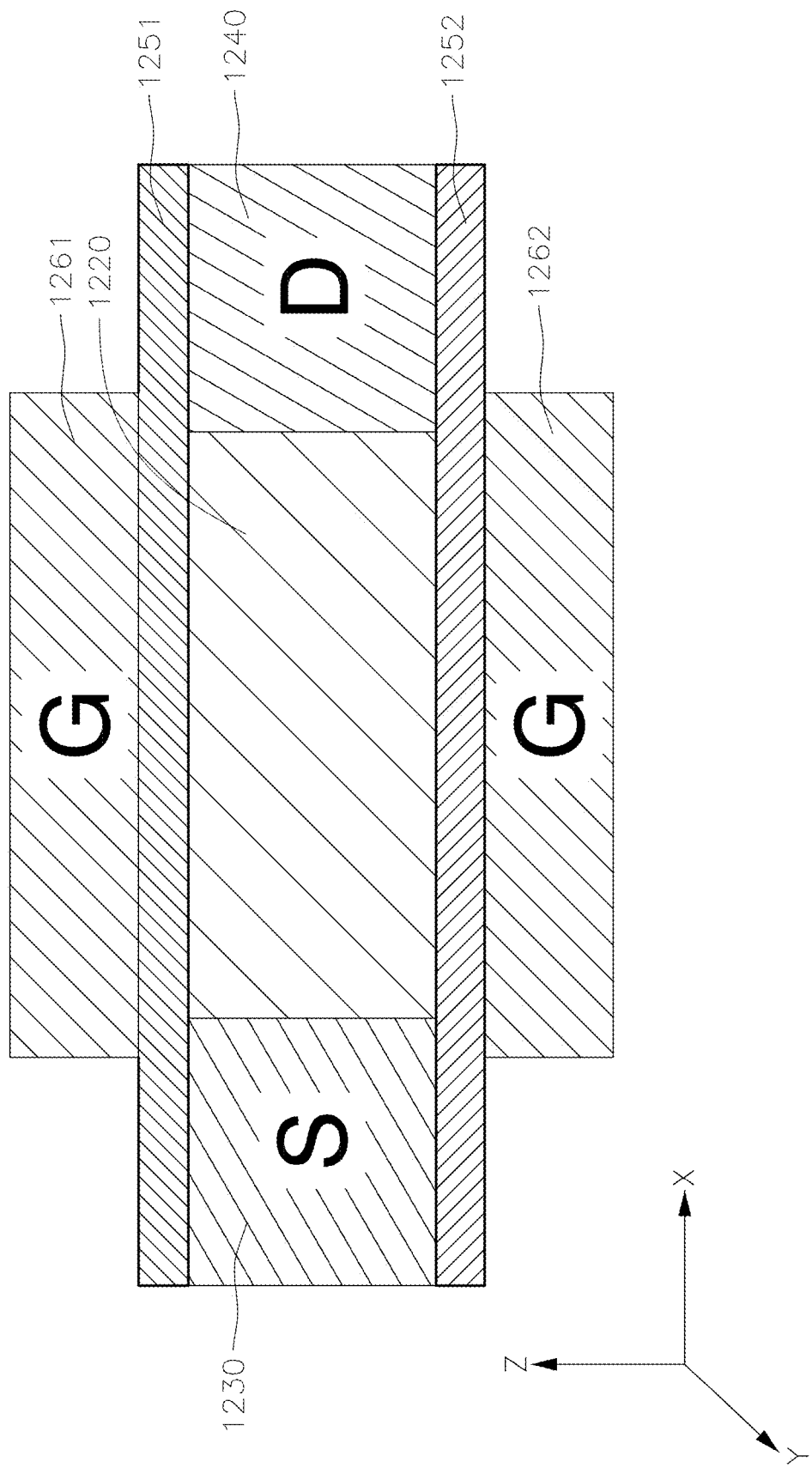
FIG. 12 is a schematic illustration of a planar double gate MOSFET.

FIG. 12 is a schematic illustration of a planar double gate MOSFET. Referring to FIG. 12, the double gate MOSFET includes a channel region 1220, a source region 1230 and a drain region 1240 on each side of the channel region 1220 along a first direction (e.g., the x-axis direction). Instead of one gate on top of the channel region as shown in FIG. 1, the double gate MOSFET has a top gate 1261 and a bottom gate 1262 sandwiching the channel region therebetween along a second direction (e.g., the z-axis direction). The double gate MOSFET further includes a top gate oxide layer 1251 between the channel region 1220 and the top gate electrode 1261 and a bottom gate oxide layer 1252 between the channel region 1220 and the bottom gate electrode 1270. In addition, the double gate MOSFET may further include a substrate under the bottom gate 1270.

The out-most atomic layer of the channel region, e.g., the top-most atomic layer of the channel region 1220 in contact with the top gate oxide layer 1251 and/or the bottom-most atomic layer of the channel region 1220 in contact with the bottom gate oxide layer 1252, may have the first atomic configuration according to embodiments of the present disclosure. In addition, the interface between the channel region and the top and bottom gate oxide layers may be 1 angstrom or lower. In one embodiment, the surface roughness is 0.9 angstroms.

In one embodiment, only the out-most atomic layer of the channel region 1220 in contact with the top gate oxide layer 1251 has the first atomic configuration. In another embodiment, both the top-most atomic layer of the channel region 1220 in contact with the top gate oxide layer 1251 and the bottom-most atomic layer of the channel region 1220 in contact with the bottom gate oxide layer 1252 have the first atomic configuration according to embodiments of the present disclosure.

Figure 13:
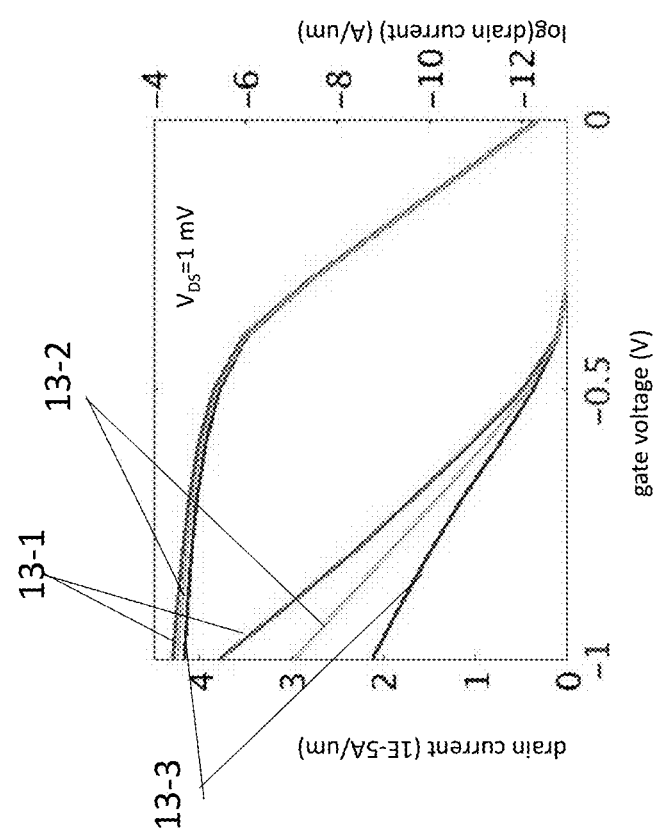
FIG. 13 shows the simulated $I_D$-$V_G$ curves of silicon double-gate pFETs with different gate-oxide interface conditions.

FIG. 13 shows the simulated $I_D$-$V_G$ curves of a silicon double-gate pFETs with different gate-oxide interface conditions. The channel thickness is 9 nm for all three devices and the $V_{DS}$ is 1 mV. Three different results were obtained depending on how the channel atoms on the gate oxide interfaces are terminated. In FIG. 13, 13-1 corresponds to a device according to embodiments of the present disclosure, i.e., where the out-most layers (e.g., both the top-most layer and the bottom-most layer) of the channel material has the first atomic configuration (i.e., every two adjacent atoms in the top-most atomic layer and every two adjacent atoms in the bottom-most atomic layer are connected through a single intervening atom located in the second out-most or second bottom-most atomic layer respectively along the source region to drain region direction), and also the interface between the channel region and the gate oxide layer is atomically smooth (e.g., with a surface roughness of about 1 angstrom or lower). 13-2 corresponds to a case where the out-most layer (e.g., both the top-most layer and the bottom-most layer) of the channel material has non-negligible surface roughness (e.g., 4 angstroms) so its hole mobility are not affected by the atomic interface effect. 13-3 corresponds to the case where the out-most layer (e.g., both the top-most layer and the bottom-most layer) of the channel material has the second atomic configuration and does not have the first atomic configuration (i.e., instead of the first configuration, every two adjacent atoms in the top-most atomic layer or the bottom-most atomic layer are connected through three intervening atoms located under it along the source region to drain region direction), and the interface between the channel region and the gate oxide layer is atomically smooth (e.g., with a surface roughness of about 1 angstrom or lower).

As shown in FIG. 13, when both the atoms in the out-most atomic layer are arranged in the first atomic configuration according to embodiments of the present disclosure and the interface between the channel region and the gate oxide layer is atomically smooth, the on-current level of the simulated p-type MOSFET of 13-1 is improved more than 20% (e.g., about 30%) compared to 13-2, and improved more than 60% (e.g., about 70%) compared to 13-3.

While FIG. 12 shows a planar p-type double gate MOSFET, the present disclosure is not limited thereto. For example, a vertical double gate MOSFET, a FinFET, a FlexFET, etc., may be manufactured according to embodiments of the present disclosure, in which at the interface between the channel region and the gate oxide layer, the out-most atomic layer of the channel region has the first atomic configuration, and the interface has the surface roughness of 1 angstrom or lower.

Figure 14C:
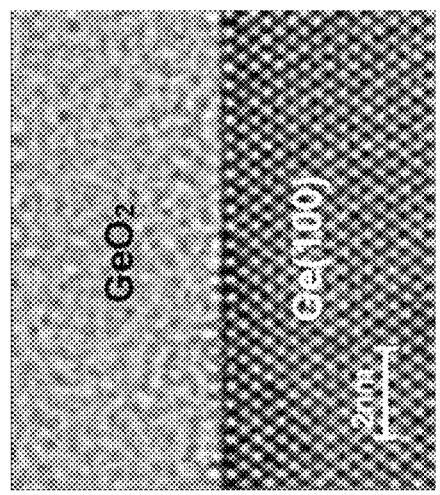
FIGS. 14A-14C are transmission electron micrograph showing atomically smooth interface between a gate oxide layer and a channel region.
Figure 14B:
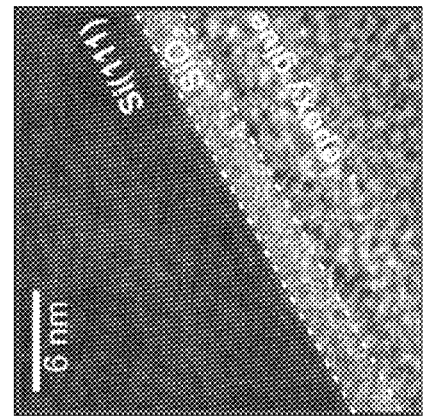
Figure 14A:
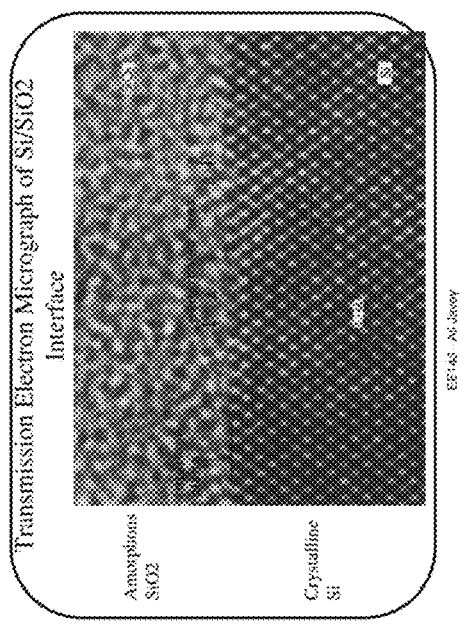

FIGS. 14A-14C are transmission electron micrographs showing atomically smooth interface between a gate oxide layer and a channel region. As shown in FIGS. 14A-14C, atomically smooth interface between $Si/SiO_2$, $Si(111)/SiO$, and $Ge(111)/GeO_2$ can be achieved through careful control of deposition of the gate oxide layer and the channel region to be defect free.

According to an embodiment of the present disclosure, a method to manufacture a plurality of p-type MOSFET with consistent performance includes controlling a surface roughness of an interface between the channel region and the gate oxide layer. The surface roughness may be controlled through any suitable method. By way of example, the surface roughness may be a set or predetermined value, such as an RMS value of about 1 angstrom, 2 angstroms, 4 angstroms, 5 angstroms, or 6 angstroms. When the surface roughness is smaller than the set or predetermined value, the surface (e.g., the top surface of the channel region to be in contact with the gate oxide layer) may be roughened by any suitable method, such as etching, intentionally incomplete deposition of the out-most atomic layer, etc. When the surface roughness is greater than the set or predetermined value, the surface (e.g., the top surface of the channel region to be in contact with the gate oxide layer) may be smoothed by any suitable method, such as annealing, etc.

As shown in FIG. 13, when the surface roughness of the interface between channel region and the gate oxide layer is at a non-negligible value, the improvement in hole mobility from the specific atomic configuration on the out-most atomic layer according to embodiments of the present disclosure is not as significant as when the interface is atomically smooth. Therefore, by controlling the surface roughness at the interface between the channel region and the gate oxide layer, multiple p-type MOSFETs manufactured across devices or chips may have consistent and uniform performance.

In one embodiment, the surface roughness may be controlled to be about 1 angstrom, and each of the p-type MOSFETs may have the channel region engineered such that the out-most atomic layer of the channel region has the first atomic configuration (i.e., every two adjacent atoms in the out-most atomic layer are connected through a single intervening atom located under it), thereby providing a plurality of p-type MOSFETs with the improved performance.

In one embodiment, the surface roughness may be controlled to be about 4 angstroms, and the configuration of the out-most atomic layer of the channel is not particularly controlled, thereby providing a plurality of p-type MOSFETs with consistent performance similar to 13-2 of FIG. 13.

Without being bound by any particular theory, it is believed that when the two adjacent atoms in the out-most atomic layer are connected through a single intervening atom in the atomic layer under it in the cross-section cutting along the plane parallel to the first direction (along source region/channel region/drain region direction) and the second direction (thickness direction or along channel region/gate oxide layer/gate electrode direction), and when the interface between the channel region and the gate oxide layer is atomically smooth (e.g., with a surface roughness of 1 angstrom or lower), hole mobility is significantly improved, thereby improving the speed of the p-type MOSFET. However, the theory should not apply to an n-type MOSFET where electrons are the current carriers.

In related art, sometimes a plurality of p-type MOSFET manufactured under the same or substantially the same conditions show significant variation in performance. Without being bound by any particular theory, it is believed that the inconsistency in global roughness (e.g., roughness of the channel region and the gate oxide layer interface across a wafer or multiple wafers) in addition to inconsistency in the atomic configuration of the out-most atomic layer of the channel region led to the inconsistency in the device performance, as evidenced by FIG. 13. That is, while transistors can be made locally smooth and end at a correct orientation, ensuring that all transistors across a device (and across a wafer) end at a defined orientation may be more difficult (e.g., some parts of a chip will be smooth, but in the wrong orientation when the out-most layer differs by 1 layer from the out-most layer of other devices). This may have led to the inconsistent performance described above. Therefore, a method accordingly to embodiments of the present disclosure, e.g., intentionally introducing roughness, will resolve the problem. That is, by controlling the surface roughness to a set or predetermined value (e.g., greater than about 3 angstroms), the device may have more consistent performance even when the atomic configuration of the out-most atomic layer of the channel region changes randomly from device to device. When the surface roughness and the atomic configuration of the out-most atomic layer of the channel region are both controlled according to embodiments of the present disclosure, plurality of p-type MOSFETs with consistent high performance many be manufactured.

While this invention has been described in detail with particular references to exemplary embodiments thereof, the exemplary embodiments described herein are not intended to be exhaustive or to limit the scope of the invention to the exact forms disclosed. Persons skilled in the art and technology to which this invention pertains will appreciate that alterations and changes in the described structures and methods of assembly and operation can be practiced without meaningfully departing from the principles, spirit, and scope of this invention, as set forth in the following claims, and equivalents thereof.

What is claimed is:

1. A method of manufacturing a p-type metal-oxide-semiconductor field-effect transistor (p-type MOSFET), the method comprising:

depositing a channel material on a substrate to form a channel region, forming a source region and a drain region on each side of the channel region along a first direction, depositing a gate oxide layer on the channel region, and depositing a gate electrode on the gate oxide layer, wherein the channel material comprises a group IV element or III-V semiconductor compound, the channel material having a diamond or zincblende cubic crystal structure, wherein the depositing of the channel material comprises:

aligning a <001> direction of the diamond or zincblende cubic crystal structure to be perpendicular to a surface of the substrate on which the channel region is formed on, and wherein, along the first direction, two adjacent atoms on an out-most atomic layer of the channel region in contact with the gate oxide layer are connected to each other via a single intervening atom in an atomic layer immediately next to it in the diamond or zincblende cubic crystal structure, and controlling a surface roughness of an interface between the gate oxide layer and the channel region to be 1 angstrom or lower.

2. The method of claim 1, wherein the depositing of the channel material further comprises:

depositing the channel material on the substrate to form an intermediate layer, the intermediate layer having a thickness lower than a target thickness of the channel region, checking a number of intervening atoms between two adjacent atoms on an out-most atomic layer of the intermediate layer, and depositing a determined number of atomic layers of the channel material on the intermediate layer such that two adjacent atoms on the out-most atomic layer of the channel region are connected to each other via a single intervening atom in the layer immediately next to it in the diamond or zincblende cubic crystal structure, and the channel region has the target thickness.

3. The method of claim 2, wherein the intermediate layer is selected from first to fifth atomic layers deposited on the substrate, and the determined number of atomic layers comprises one or more atomic layers needed for the channel region to reach the target thickness.

4. The method of claim 2, wherein the channel region has a total number of n atomic layers, n being an integer greater than 5, and the intermediate layer is selected to be an n−1 or n−2 atomic layer.

5. The method of claim 1, wherein the depositing of the channel material comprises growing the channel material on the substrate epitaxially, or depositing the channel material through atomic layer CVD (ALCVD) or atomic layer deposition (ALD).

6. The method of claim 1, wherein the channel material comprises silicon (Si), germanium (Ge), gallium nitride (GaN), indium arsenide (InAs), gallium phosphide (GaP), gallium antimonide (GaSb), indium phosphide (InP), gallium arsenide (GaAs), or indium antimonide (InSb).

7. The method of claim 1, wherein the gate oxide layer comprises silicon dioxide ($SiO_2$), hafnium oxide ($HfO_2$), hafnium silicon oxide ($HfSiO_2$), lanthanum oxide ($La_2O_3$), lanthanum aluminum oxide ($LaAlO_3$), zirconium oxide ($ZrO_2$), zirconium silicon oxide ($ZrSiO_4$), tantalum oxide ($Ta_2O_5$), titanium oxide ($TiO_2$), strontium titanate ($SrTiO_3$), yttrium oxide ($Y_2O_3$), aluminum oxide ($Al_2O_3$), lead scandium tantalate ($PbSc_{0.5}Ta_{0.5}O_3$), or lead zinc niobate ($PbZnNbO_3$).

8. The method of claim 1, wherein the surface roughness is less than 1 angstrom.

9. The method of claim 1, wherein the controlling of the surface roughness comprises annealing the channel region prior to the depositing of the gate oxide layer.

10. A method of manufacturing a p-type metal-oxide-semiconductor field-effect transistor (MOSFET), the method comprising:

depositing a channel material on a first region of a substrate to form a first channel region, controlling a surface roughness of a first surface of the first channel region to a set value, forming a first source region and a first drain region on each side of the first channel region along a first direction, depositing a first gate oxide layer on the first surface of the first channel region, and depositing a first gate electrode on the first gate oxide layer to provide a first p-type MOSFET, wherein the channel material comprises a group IV element or III-V semiconductor compound, the channel material having a diamond or zincblende cubic crystal structure, and a <001> direction of the diamond or zincblende cubic crystal structure is parallel to a second direction, the second direction being perpendicular to a surface of the substrate on which the first channel region is formed on, wherein the controlling of the surface roughness comprises etching, intentionally incomplete deposition of the out-most atomic layer, or annealing.

11. The method of claim 10, wherein the set value of the surface roughness is about 4 angstroms or greater.

12. The method of claim 10, further comprising:

depositing the channel material on a second region of the substrate to form a second channel region, controlling a surface roughness of a first surface of the second channel region to the set value, forming a second source region and a second drain region on each side of the second channel region along the first direction, depositing a second gate oxide layer on the first surface of the second channel region, and depositing a second gate electrode on the second gate oxide layer to provide a second p-type MOSFET, wherein the set value of the surface roughness is about 4 angstroms or greater.

13. The method of claim 10, wherein the set value of the surface roughness is 1 angstrom or lower, and wherein the depositing of the channel material comprises:

aligning the <001> direction of the diamond or zincblende cubic crystal structure to be parallel to the second direction, and wherein, along the first direction, two adjacent atoms on an out-most atomic layer of the first channel region in contact with the first gate oxide layer are connected to each other via a single intervening atom in an atomic layer immediately next to it in the diamond or zincblende cubic crystal structure.

14. The method of claim 13, wherein the depositing of the channel material further comprises:

depositing the channel material on the substrate to form an intermediate layer, the intermediate layer having a thickness lower than a target thickness of the first channel region, checking a number of intervening atoms between two adjacent atoms on an out-most atomic layer of the intermediate layer, and depositing a determined number of atomic layers of the channel material on the intermediate layer such that two adjacent atoms on the out-most atomic layer of the first channel region are connected to each other via a single intervening atom in the layer immediately next to it, and the first channel region has the target thickness.

15. A p-type metal-oxide-semiconductor field-effect transistors (MOSFET) comprising:

a source region, a drain region, and a channel region between the source region and the drain region, along a first direction, a gate electrode over the channel region, and a gate oxide layer between the gate electrode and the channel region, wherein the channel region comprises a channel material comprising a group IV element or III-V semiconductor compound, the channel material having a diamond or zincblende cubic crystal structure, and a <001> direction of the diamond or zincblende cubic crystal structure is perpendicular to a surface of the substrate on which the channel region is formed on, wherein, along the first direction, two adjacent atoms on an out-most atomic layer of the channel region in contact with the gate oxide layer are connected to each other via a single intervening atom in an atomic layer immediately next to it in the diamond or zincblende cubic crystal structure, and wherein an interface between the gate oxide layer and the channel region has a surface roughness of 1 angstrom or lower.

16. The p-type MOSFET of claim 15, wherein the channel material comprises silicon (Si), germanium (Ge), gallium nitride (GaN), indium arsenide (InAs), gallium phosphide (GaP), gallium antimonide (GaSb), indium phosphide (InP), gallium arsenide (GaAs), or indium antimonide (InSb).

17. The p-type MOSFET of claim 15, wherein the surface roughness is less than 1 angstrom.

18. The p-type MOSFET of claim 15, wherein a hole mobility of the channel region is greater than a hole mobility of a bulk counterpart of the same channel material.

19. The p-type MOSFET of claim 15, wherein the gate oxide layer comprises silicon dioxide ($SiO_2$), hafnium oxide ($HfO_2$), hafnium silicon oxide ($HfSiO_2$), lanthanum oxide ($La_2O_3$), lanthanum aluminum oxide ($LaAlO_3$), zirconium oxide ($ZrO_2$), zirconium silicon oxide ($ZrSiO_4$), tantalum oxide ($Ta_2O_5$), titanium oxide ($TiO_2$), strontium titanate ($SrTiO_3$), yttrium oxide ($Y_2O_3$), aluminum oxide ($Al_2O_3$), lead scandium tantalate ($PbSc_{0.5}Ta_{0.5}O_3$), or lead zinc niobate ($PbZnNbO_3$).

20. The p-type MOSFET of claim 15, selected from a planar MOSFET, a multi-gate FET, a double gate MOSFET, a tri-gate MOSFET, a fin field-effect transistor (FinFET), a FlexFET, a thin film transistor, a gate-all-around MOSFET (GAAFET), and a multi-bridge channel FET (MBCFET).

* * * * *